(12) United States Patent
Mishra et al.

(10) Patent No.: US 12,176,920 B2
(45) Date of Patent: Dec. 24, 2024

(54) BOSE-CHADHURI-HOCQUENGHEM (BCH) ENCODER AND METHOD FOR GENERATING A BCH SIGNAL FOR NAVIGATION SIGNAL

(71) Applicant: INDIAN SPACE RESEARCH ORGANISATION, Bangalore (IN)

(72) Inventors: Deepak Mishra, Ahmedabad (IN); Neeraj Mishra, Ahmedabad (IN); Sanjay D. Mehta, Ahmedabad (IN)

(73) Assignee: INDIAN SPACE RESEARCH ORGANISATION, Bangalore (IN)

( * ) Notice: Subject to any disclaimer, the term of this patent is extended or adjusted under 35 U.S.C. 154(b) by 0 days.

(21) Appl. No.: 18/261,040

(22) PCT Filed: Sep. 21, 2021

(86) PCT No.: PCT/IN2021/050922
§ 371 (c)(1),
(2) Date: Jul. 11, 2023

(87) PCT Pub. No.: WO2022/153325
PCT Pub. Date: Jul. 21, 2022

(65) Prior Publication Data
US 2024/0063824 A1 Feb. 22, 2024

(30) Foreign Application Priority Data
Jan. 12, 2021 (IN) .............................. 202141001342

(51) Int. Cl.
*H03M 13/00* (2006.01)
*H03M 13/15* (2006.01)
(52) U.S. Cl.
CPC ....... *H03M 13/152* (2013.01); *H03M 13/158* (2013.01)

(58) Field of Classification Search
None
See application file for complete search history.

(56) References Cited

U.S. PATENT DOCUMENTS

| | | | |
|---|---|---|---|
| 8,464,141 B2 * | 6/2013 | Pilsl | H03M 13/159 |
| | | | 714/782 |
| 10,333,555 B2 * | 6/2019 | Wu | H03M 13/2906 |

(Continued)

OTHER PUBLICATIONS

China Satellite Navigation Office: BeiDou Navigation Satellite System Signal In Space Interface Control Document, Open Service Signal B1C; Version 1.0; Dec. 31, 2017, 86 pgs.

(Continued)

*Primary Examiner* — Mujtaba M Chaudry
(74) *Attorney, Agent, or Firm* — Rothwell, Figg, Ernst and Manbeck, P.C.

(57) ABSTRACT

Embodiment herein provide a Bose-Chadhuri-Hocquenghem (BCH) encoder for generating a BCH signal. The BCH encoder (1) includes a memory for storing a minimum distance to be used for generating the BCH signal for a BCH code (n, k) and a polynomial generator for generating a generator polynomial for the BCH code (n, k) and encoding the generator polynomial to obtain the BCH signal. The polynomial generator includes a set of k registers (4) connected in series to receive the information bits and output an encoded bit based on a clock signal, a first gate (5) to receive a code length, a number of information bits, and the minimum distance as input, a second gate (6), and a finite field adder circuit (7) for determining a finite field sum of the output of each register of the set of k registers (4).

14 Claims, 8 Drawing Sheets

(56) References Cited

U.S. PATENT DOCUMENTS

| | | | |
|---|---|---|---|
| 11,070,312 B1* | 7/2021 | Oveis Gharan ... | H03M 13/6572 |
| 2005/0149834 A1* | 7/2005 | Chen .................... | H03M 13/05 |
| | | | 714/781 |
| 2009/0135717 A1* | 5/2009 | Kamal ................ | H04L 41/0896 |
| | | | 370/225 |
| 2017/0149444 A1* | 5/2017 | Lin ..................... | H03M 13/116 |
| 2020/0097360 A1* | 3/2020 | Lu .......................... | G11C 29/52 |
| 2021/0044306 A1* | 2/2021 | Meyer ................. | H03M 13/616 |

OTHER PUBLICATIONS

International Search Report issued in PCT/IN2021/050922 dated Nov. 26, 2021, 2 pages.

* cited by examiner

BOSE-CHADHURI-HOCQUENGHEM (BCH) ENCODER AND METHOD FOR GENERATING A BCH SIGNAL FOR NAVIGATION SIGNAL

CROSS REFERENCE TO RELATED APPLICATIONS

This application is a 35 U.S.C. 371 National Phase Entry Application from PCT/IN2021/050922 filed Sep. 21, 2021, which claims priority to and the benefit of Indian patent application No. 202141001342, filed on Jan. 12, 2021, the disclosures of which are incorporated herein by reference in their entireties.

FIELD OF THE INVENTION

The present disclosure relates to cyclic code encoding technologie, in particular to Bose-Chadhuri-Hocquenghem (BCH) encoder for generating a BCH signal such as a BCH code generator polynomial for navigation signal.

BACKGROUND

BCH error correction code (hereinafter referred to as BCH code) is one of cyclic codes in linear block codes, and can be very easily implemented on a circuit and widely used. As a cyclic code, the BCH code may be represented by a specific polynomial. This polynomial is in turn referred to as the generator polynomial g (x) of the BCH code. The generator polynomials g (x) are different for BCH codes with different designed error correction capabilities.

Further, the BCH codes are introduced in navigation system to reduce the bit error rate of system. However, existing BCH codes cannot be directly used for the navigation system as it increases complexity of the encoding with an increase in a count of bit errors, which in turn translates into a more complicated design of the BCH encoders. The increase in design complexity increases the processing time, which leads to increased cost.

Hence there remains a need of an efficient BCH encoder that has a simpler implementation, and operates faster, and that overcomes the above-mentioned limitations of conventional BCH encodes for the navigation system.

OBJECT OF THE INVENTION

The principal object of the embodiment herein is to provide Bose-Chadhuri-Hocquenghem (BCH) encoder and method for generating a BCH signal such as a BCH code generator polynomial for navigation signal.

Another object of the embodiments herein is to provide three BCH (52, 9) wide sense primitive polynomials and two BCH (52, 9) wide sense non primitive polynomials. The dmin of these three polynomials is 20.

Yet another object of the embodiments herein is to provide one BCH (64, 17) wide sense non primitive polynomial. The dmin of this polynomial is 23.

SUMMARY

In one aspect the object is satisfied by providing a Bose-Chadhuri-Hocquenghem (BCH) encoder for generating a BCH signal. The BCH encoder includes a memory and a polynomial generator connected to the memory. The memory stores a minimum distance to be used for generating the BCH signal for a BCH code (n, k), where n is a code length in bits, and k is a number of information bits. The polynomial generator generates a generator polynomial for the BCH code (n, k) based on the code length, the number of information bits, and the minimum distance, and encodes the generator polynomial to obtain the BCH signal. The polynomial generator includes a set of k registers connected in series, a first gate, a second gate, and a finite field adder circuit connected to the second gate. The set of k registers receives the information bits and output an encoded bit based on a clock signal. The first gate receives the code length, the number of information bits, and the minimum distance as input. The finite field adder circuit determines a finite field sum of the output of each register of the set of k registers.

In an embodiment, encoding the generator polynomial using the BCH code (n, k) includes connecting the first gate and disconnecting the second gate during a first k clock periods of the BCH encoder, and disconnecting the first gate and connecting the second gate after the first k clock period.

In an embodiment, the BCH code (n, k) is one of a BCH (52, 9) primitive code, a BCH (52, 9) non-primitive code, and a BCH (64, 17) non-primitive code.

In an embodiment, the minimum distance of the BCH (52, 9) primitive code, and the BCH (52, 9) non-primitive code is 20.

In an embodiment, the minimum distance of the BCH (64, 17) non-primitive code is 23.

In an embodiment, the generator polynomial of the BCH (52, 9) primitive code is one of $x^9+x^8+x^7+x^6+x^2+x+1$, $x^9+x^7+x^6+x^3+x^2+x+1$, and $x^9+x^8+x^7+x^3+x^2+x+1$.

In an embodiment, the generator polynomial of the BCH (52, 9) non-primitive code is one of $x^9+x^8+x^7+x^6+x^5+x^3+x^2+x+1$, and $x^9+x^8+x^7+x^6+x^5+x^4+x^2+x+1$.

In an embodiment, the generator polynomial of the BCH (64, 17) non-primitive code is $x^{17}+x^{16}+x^{14}+x^{13}+x^{10}+x^8+x^7+x+1$.

In one aspect the object is satisfied by providing a method for generating the BCH signal, The method includes detecting a BCH code (n, k) for which the BCH signal need to be generated, where n is a code length in bits, and k is a number of information bits. Further the method includes determining a minimum distance to be used for generating the BCH signal for the detected BCH code (n, k) and generating the generator polynomial for the detected BCH code (n, k) based on the code length, the number of information bits, and the minimum distance. Further, the method includes encoding the generator polynomial to obtain the BCH signal based on a clock signal.

These and other aspects of the embodiment herein will be better appreciated and understood when considered in conjunction with the following description and the accompanying drawings. It should be understood, however, that the following descriptions, while indicating preferred embodiment and numerous specific details thereof, are given by way of illustration and not of limitation. Many changes and modifications may be made within the scope of the embodiment herein without departing from the spirit thereof, and the embodiment herein include all such modifications.

BRIEF DESCRIPTION OF FIGURES

The proposed autonomous surface cleaning device is illustrated in the accompanying drawings, throughout which like reference letters indicate corresponding parts in the various figures. The embodiment herein will be better understood from the following description with reference to the drawings, in which.

DETAILED DESCRIPTION

Figure 1:
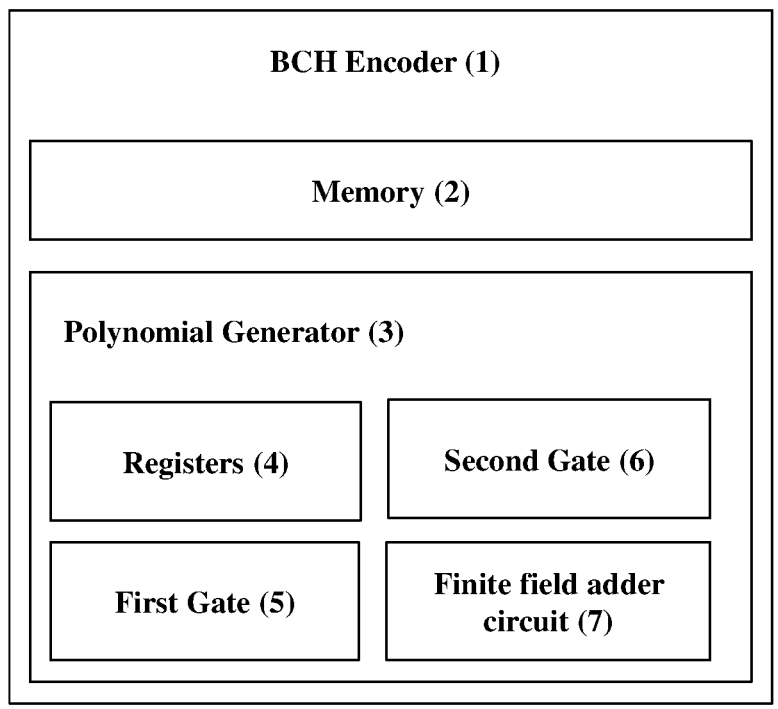
FIG. 1 illustrates a block diagram of a BCH encoder, according to embodiment as disclosed herein.

The embodiment herein and the various features and advantageous details thereof are explained more fully with reference to the non-limiting embodiment that are illustrated in the accompanying drawings and detailed in the following description. Descriptions of well-known components and processing techniques are omitted so as to not unnecessarily obscure the embodiment herein. Also, the various embodiment described herein are not necessarily mutually exclusive, as some embodiment can be combined with one or more other embodiment to form new embodiment. The term "or" as used herein, refers to a non-exclusive or, unless otherwise indicated. The examples used herein are intended merely to facilitate an understanding of ways in which the embodiment herein can be practiced and to further enable those skilled in the art to practice the embodiment herein. Accordingly, the examples should not be construed as limiting the scope of the embodiment herein.

The accompanying drawings are used to help easily understand various technical features and it should be understood that the embodiment presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Referring now to the drawings, and more particularly to FIGS. 2-8, there are shown preferred embodiment.

FIG. 1 illustrates a block diagram of a BCH encoder (1), according to embodiment as disclosed herein. Generally, The BCH can be classified in two type such as primitive BCH polynomial and non-primitive BCH polynomial. In the primitive BCH polynomial, for any positive integers $m (m \geq 3)$ and t ($t < 2^{m-1}$), there exists a binary BCH code with the following parameters:

Block length: $n = 2^m - 1$
Number of parity-check digits: $n - k \leq mt$
Minimum distance: $d_{min} \geq 2t + 1$.

Clearly, this code is capable of correcting any combination of t or fewer errors in a block of $n = 2^m - 1$ digits. We call this code a t-error-correcting BCH code.

The generator polynomial of this code is specified in terms of its roots from the Galois field $GF(2^m)$. Let be a primitive element in $GF(2^m)$. The generator polynomial g(X) of the t-error correcting BCH code of length $2^m - 1$ is the lowest-degree polynomial over GF(2) which has $$\alpha, \alpha^2, \alpha^3, \ldots, \alpha^{2t} \quad (1)$$

As its roots [i.e., $g(\alpha^i) = 0$ for $1 \leq i \leq 2t$. It follows that g(X) has $\alpha, \alpha^2, \ldots, \alpha^{2t}$ and their conjugates as all its roots.

Let $\Phi_i(X)$ be the minimal polynomial of $\alpha^i$. Then g(X) must be the least common multiple (LCM) of $\Phi_1(X), \Phi_2(X), \ldots \Phi_{2t}(X)$, that is, $$g(X) = LCM\{\Phi_1(X), \Phi_2(X), \ldots, \Phi_{2t}(X)\}. \quad (2)$$

The generator polynomial g(X) of the binary t-error correcting BCH code of length $2^m - 1$ given by (2) can be reduced to $$g(X) = LCM\{\Phi_1(X), \Phi_2(X), \ldots, \Phi_{2t-1}(X)\}. \quad (3)$$

Since the degree of each minimal polynomial is m or less, the degree of g(X) is at most mt. That is, the number of parity check digits, n−k, of the code is at most equal to mt. There is no simple formula for enumerating n−k, but if t is small, n−k is exactly equal to mt. The BCH codes defined above are usually called primitive BCH codes.

Further, in the non-primitive BCH polynomial, the t-error-correcting BCH code denned above indeed has minimum distance at least 2t+1. The parameter 2t+1 is usually called the designed distance of the /-error-correcting BCH code. The true minimum distance of a BCH code may or may not be equal to its designed distance. There are many cases where the true minimum distance of a BCH code is equal to its designed distance. However, there are also cases where the true minimum distance is greater than the designed distance. The bound distance of correction capability can be increased by increasing the parity bit. If p not a primitive element of $GF(2^m)$, the code is called a nonprimitive BCH code. Binary BCH code with length $n \neq 2^m - 1$ can be constructed in the same manner as for the case $n = 2^m - 1$.

Let β be an element of order n in $GF(2^m)$, $n | 2^m - 1$ and g(x) be the binary polynomial of minimum degree that has β; $\beta_2; \ldots; \beta^{2t}$ as roots. Let ψ1(x), ψ2(x, : : : ; ψ2t (x) be the minimal poly. of $\beta, \beta^2, \ldots, \beta^{2t}$ respectively then $$g(x) = LCM\{\psi_1(x), \psi_2(x), \ldots, \psi_{2t}(x)\}$$

$$:\beta^n = 1, \beta; \beta^2; \ldots ; \beta^{2t} \text{ t}$$

are roots of $X^n + 1$ so $$g(x) | (x^n + 1)$$

Further, the BCH codes are classified into two ways such as narrow sense BCH code, and wide sense BCH code. The error correction capability of wide sense BCH polynomial is better compared to narrow sense. The proposed BCH encoder (1) and method for generating a BCH signal such as a BCH code generator polynomial for navigation signal. proposed BCH encoder (1) a memory (2) and a polynomial generator (3) connected to the memory. The memory (2) is configured for storing a minimum distance to be used for generating the BCH signal for a BCH code (n, k), where n is a code length in bits, and k is a number of information bits. The polynomial generator (3) generates a generator polynomial for the BCH code (n, k) based on the code length, the number of information bits, and the minimum distance, and encoding the generator polynomial to obtain the BCH signal. In an embodiment, the polynomial generator (3) includes a set of k registers (4), a first gate (5), a second gate (5), and a finite field adder circuit (7) connected to the second gate (6).

The set of k registers (4) is connected in series to receive the information bits and output an encoded bit based on a clock signal. The first gate (5) receives the code length, the number of information bits, and the minimum distance as input. The finite field adder circuit (7) connected to the second gate (6) for determining a finite field sum of the output of each register of the set of k registers (4).

The proposed BCH encoder (1) generates three BCH (52, 9) wide sense primitive polynomials and two BCH (52, 9) wide sense non primitive polynomials. The dmin of these three polynomials is 20. Further, the proposed BCH encoder (1) generates one BCH (64, 17) wide sense non primitive polynomial. The dmin of this polynomial is 23.

The generated three BCH (52, 9) wide sense primitive polynomials, two BCH (52, 9) wide sense non primitive polynomials, and one BCH (64, 17) wide sense non primitive polynomial is suitable for navigation system. Particularly for NavIC L1 Band signaling. Subframe 1 is encoded by using BCH (52, 9) codes or BCH (64, 17). More specifically, 9 bits are encoded by using BCH (52, 9) code or 17 Bits are encoded by using BCH (64, 17) code. After encoding, the length of Subframe 1 becomes 52 symbols or 64 symbols. The generator polynomials of these BCH encoders are shown in Table 1.

| BCH code | Encoding characteristics | | | Generator polynomials g(x) |
|---|---|---|---|---|
| | n | k | $d_{min}$ | |
| (52, 9) | 52 | 9 | 20 | $x^9 + x^8 + x^7 + x^6 + x^2 + x + 1$ (Primitive) |
| (52, 9) | 52 | 9 | 20 | $x^9 + x^7 + x^6 + x^3 + x^2 + x + 1$ (Primitive) |
| (52, 9) | 52 | 9 | 20 | $x^9 + x^8 + x^7 + x^3 + x^2 + x + 1$ (Primitive) |
| (52, 9) | 52 | 9 | 20 | $x^9 + x^8 + x^7 + x^6 + x^5 + x^3 + x^2 + x + 1$ (Non-Primitive) |
| (52, 9) | 52 | 9 | 20 | $x^9 + x^8 + x^7 + x^6 + x^5 + x^4 + x^2 + x + 1$ (Non-Primitive) |
| (64, 17) | 64 | 17 | 23 | $x^{17} + x^{16} + x^{14} + x^{13} + x^{10} + x^8 + x^7 + 1$ (Non-Primitive) |

Figure 2:
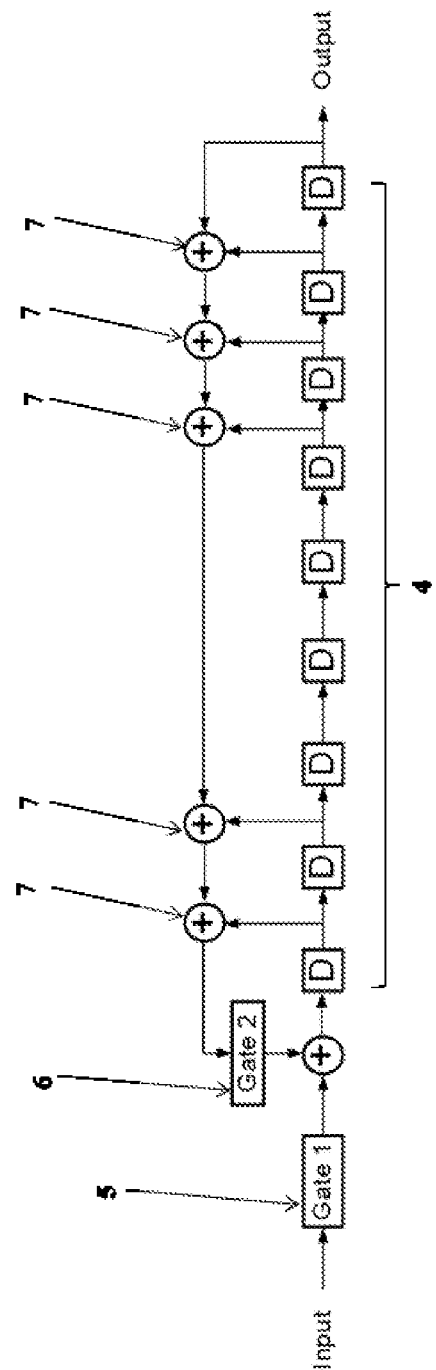
FIG. 2 illustrates a polynomial circuit for generating a first BCH code (52, 9) primitive code, according to embodiment as disclosed herein.

FIG. 2 illustrates a polynomial circuit for generating a first BCH code (52, 9) primitive code, according to embodiment as disclosed herein. In an embodiment, the polynomial circuit as shown in the FIG. 2 is used to generate the first BCH code (52, 9) primitive code. The first gate (5) is connected, and the second gate (6) is disconnected for a first k clock periods of the BCH encoder (1). Further, the first gate (5) is disconnected, and the second gate (6) is connected after the first k clock period. In this case, subframe 1 is encoded by using the first BCH (52, 9) primitive code. More specifically, 9 bits are encoded by using the first BCH (52, 9) primitive code. After encoding, a length of the subframe 1 becomes 52 symbols. The generator polynomial of the first BCH (52, 9) primitive code is $x^9+x^8+x^7+x^6+x^2+x+1$. The minimum distance of the first BCH (52, 9) primitive code is 20.

Figure 3:
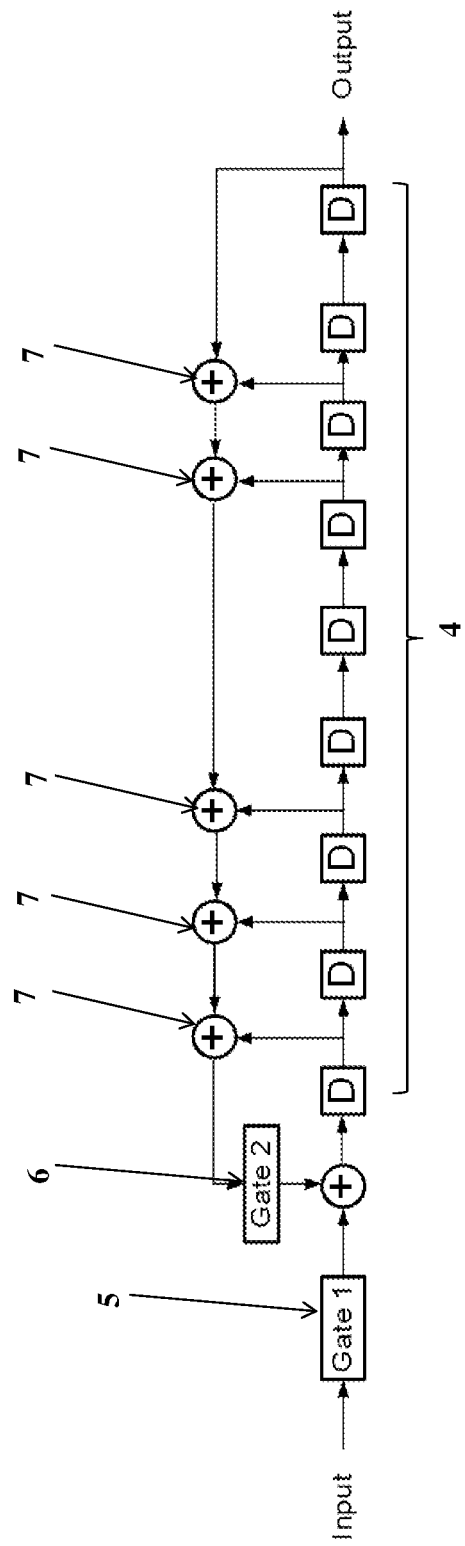
FIG. 3 illustrates a polynomial circuit for generating a second BCH code (52, 9) primitive code, according to embodiment as disclosed herein.

FIG. 3 illustrates a polynomial circuit for generating a second BCH code (52, 9) primitive code, according to embodiment as disclosed herein. In an embodiment, the polynomial circuit as shown in the FIG. 3 is used to generate the second BCH code (52, 9) primitive code. The first gate (5) is connected, and the second gate (6) is disconnected for a first k clock periods of the BCH encoder (1). Further, the first gate (5) is disconnected, and the second gate (6) is connected after the first k clock period. In this case, subframe 1 is encoded by using the second BCH (52, 9) primitive code. More specifically, 9 bits are encoded by using the second BCH (52, 9) primitive code. After encoding, a length of the subframe 1 becomes 52 symbols. The generator polynomial of the second BCH (52, 9) primitive code is $x^9+x^7+x^6+x^3+x^2+x+1$. The minimum distance of the BCH (52, 9) primitive code is 20.

Figure 4:
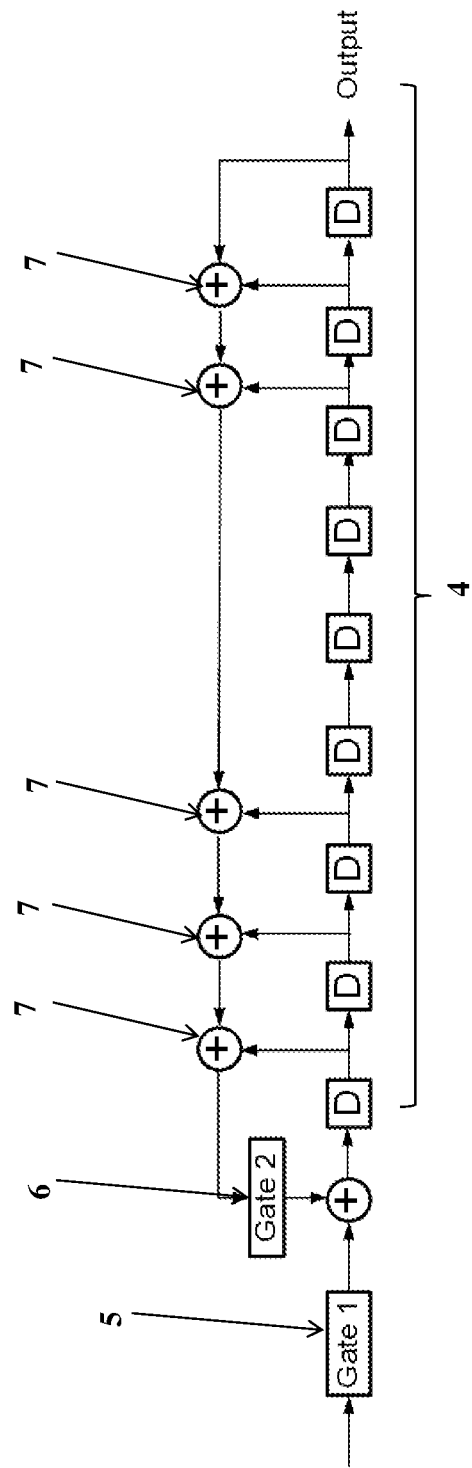
FIG. 4 illustrates a polynomial circuit for generating a third BCH code (52, 9) primitive code, according to embodiment as disclosed herein.

FIG. 4 illustrates a polynomial circuit for generating a third BCH code (52, 9) primitive code, according to embodiment as disclosed herein. In an embodiment, the polynomial circuit as shown in the FIG. 4 is used to generate the third BCH code (52, 9) primitive code. The first gate (5) is connected, and the second gate (6) is disconnected for a first k clock periods of the BCH encoder (1). Further, the first gate (5) is disconnected, and the second gate (6) is connected after the first k clock period. In this case, subframe 1 is encoded by using the third BCH (52, 9) primitive code. More specifically, 9 bits are encoded by using the third BCH (52, 9) primitive code. After encoding, a length of the subframe 1 becomes 52 symbols. The generator polynomial of the third BCH (52, 9) primitive code is $x^9+x^8+x^7+x^3+x^2+x+1$. The minimum distance of the third BCH (52, 9) primitive code is 20.

Figure 5:
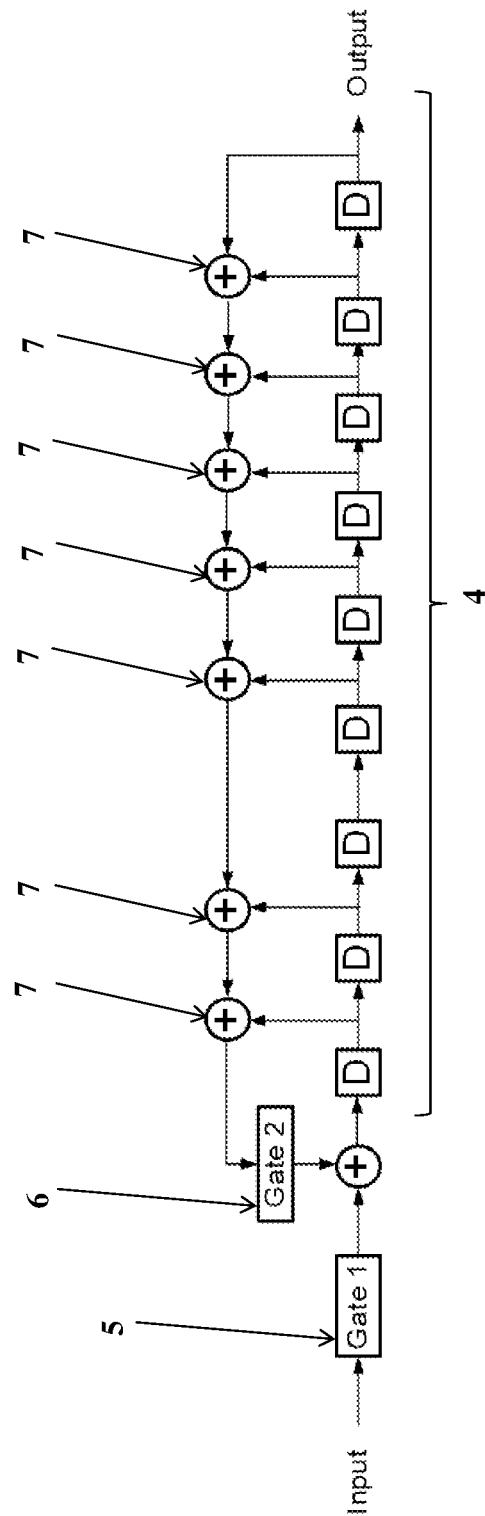
FIG. 5 illustrates a polynomial circuit for generating a first BCH code (52, 9) non-primitive code, according to embodiment as disclosed herein.

FIG. 5 illustrates a polynomial circuit for generating a first BCH code (52, 9) non-primitive code, according to embodiment as disclosed herein. In an embodiment, the polynomial circuit as shown in the FIG. 5 is used to generate the first BCH code (52, 9) non-primitive code. The first gate (5) is connected, and the second gate (6) is disconnected for a first k clock periods of the BCH encoder (1). Further, the first gate (5) is disconnected, and the second gate (6) is connected after the first k clock period. In this case, subframe 1 is encoded by using the first BCH (52, 9) non-primitive code. More specifically, 9 bits are encoded by using the first BCH (52, 9) non-primitive code. After encoding, a length of the subframe 1 becomes 52 symbols. The generator polynomial of the first BCH (52, 9) non-primitive code is $x^9+x^8+x^7+x^6+x^5+x^3+x^2+x+1$. The minimum distance of the first BCH (52, 9) non-primitive code is 20.

Figure 6:
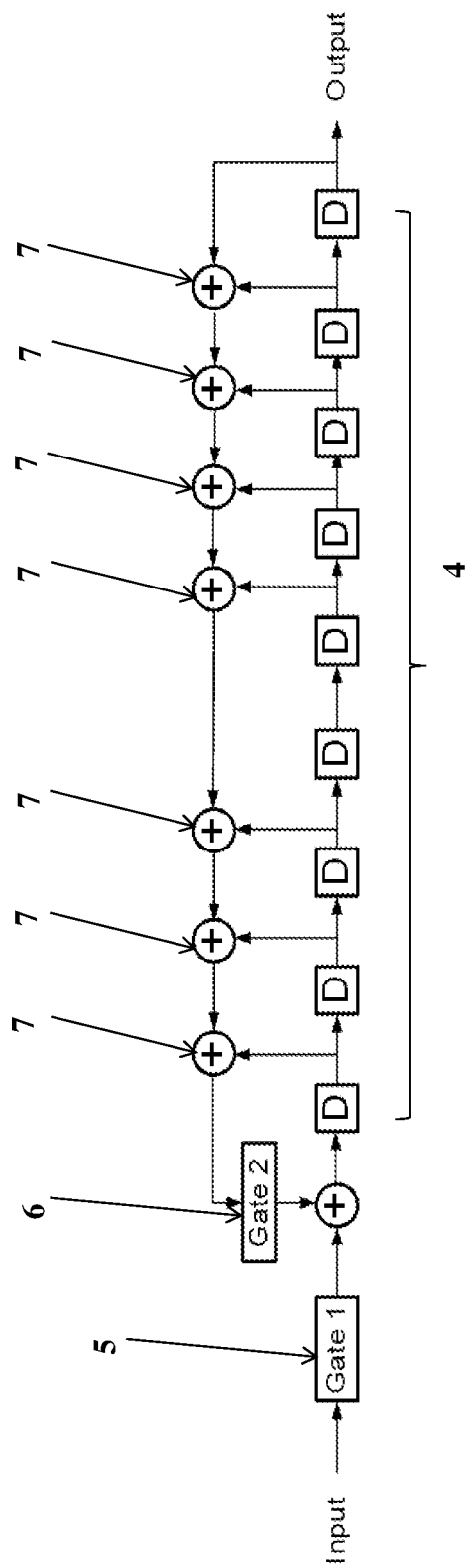
FIG. 6 illustrates a polynomial circuit for generating a second BCH code (52, 9) non-primitive code, according to embodiment as disclosed herein.

FIG. 6 illustrates a polynomial circuit for generating a second BCH code (52, 9) non-primitive code, according to embodiment as disclosed herein. In an embodiment, the polynomial circuit as shown in the FIG. 6 is used to generate the second BCH code (52, 9) non-primitive code. The first gate (5) is connected, and the second gate (6) is disconnected for a first k clock periods of the BCH encoder (1). Further, the first gate (5) is disconnected, and the second gate (6) is connected after the first k clock period. In this case, subframe 1 is encoded by using the second BCH (52, 9) non-primitive code. More specifically, 9 bits are encoded by using the second BCH (52, 9) non-primitive code. After encoding, a length of the subframe 1 becomes 52 symbols. The generator polynomial of the second BCH (52, 9) non-primitive code is $x^9+x^8+x^7+x^6+x^5+x^4+x^2+x+1$. The minimum distance of the second BCH (52, 9) non-primitive code is 20.

Figure 7:
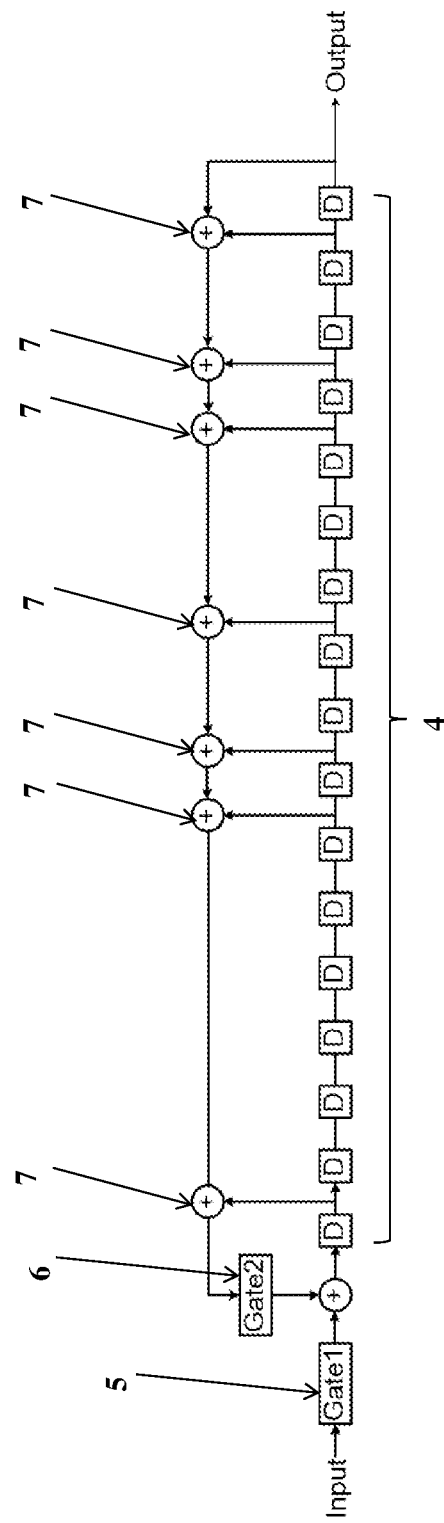
FIG. 7 illustrates a polynomial circuit for generating a second BCH code (64, 17) non-primitive code, according to embodiment as disclosed herein.

FIG. 7 illustrates a polynomial circuit for generating a second BCH code (64, 17) non-primitive code, according to embodiment as disclosed herein. In an embodiment, the polynomial circuit as shown in the FIG. 7 is used to generate the BCH code (64, 17) non-primitive code. The first gate (5) is connected, and the second gate (6) is disconnected for a first k clock periods of the BCH encoder (1). Further, the first gate (5) is disconnected, and the second gate (6) is connected after the first k clock period. In this case, subframe 1 is encoded by using the BCH (64, 17) non-primitive code. More specifically, 17 Bits arm encoded by using the BCH (64, 17) non-primitive code. After encoding, a length of the subframe 1 becomes 64 symbols. The generator polynomial of the BCH (64, 17) non-primitive code is $x^{17}+x^{16}+x^{14}+x^{13}+x^{10}+x^8+x^7+1$. The minimum distance of the BCH (64, 17) non-primitive code is 23.

Figure 8:
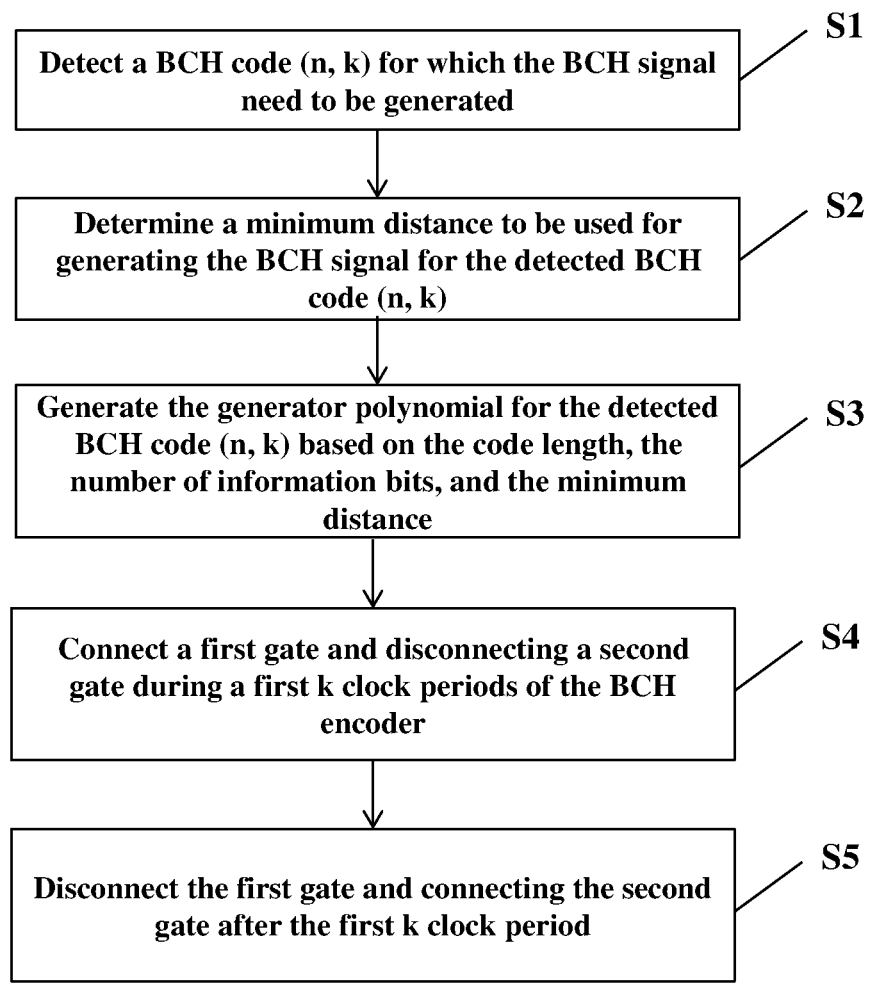
FIG. 8 is a flow diagram illustrating a method for generating a BCH signal for navigation signal, according to embodiment as disclosed herein.

FIG. 8 is a flow diagram illustrating a method for generating a BCH signal for navigation signal, according to embodiment as disclosed herein. At step S1, the method includes detecting, by the encoder (1), a BCH code (n, k) for which the BCH signal need to be generated, where n is a code length in bits, and k is a number of information bits. The BCH code (n, k) described herein is one of a BCH (52, 9) primitive code, a BCH (52, 9) non-primitive code, and a BCH (64, 17) non-primitive code.

At step S2, the method includes determining, by the BCH encoder (1), a minimum distance to be used for generating the BCH signal for the detected BCH code (n, k). In an embodiment, the minimum distance of the BCH (52, 9) primitive code, and the BCH (52, 9) non-primitive code is 20. In an embodiment, the minimum distance of the BCH (64, 17) non-primitive code is 23.

At step S3, the method includes generating, by the BCH encoder (1), the generator polynomial for the detected BCH code (n, k) based on the code length, the number of information bits, and the minimum distance. In an embodiment, the generator polynomial of the BCH (52, 9) primitive code is one of $x^9+x^8+x^7+x^6+x^2+x+1$, $x^9+x^7+x^6+x^3+x^2+x+1$, and $x^9+x^8+x^7+x^3+x^2+x+1$. In an embodiment, the generator polynomial of the BCH (52, 9) non-primitive code is one of $x^9+x^8+x^7+x^6+x^5+x^3+x^2+x+1$, and $x^9+x^8+x^7+x^6+x^5+x^4+x^2+x+1$. In an embodiment, the generator polynomial of the BCH (64, 17) non-primitive code is $x^{17}+x^{16}+x^{14}+x^{13}+x^{10}+x^8+x^7+1$.

At step S4, the method includes connecting, by the BCH encoder (1), a first gate (5) and disconnecting a second gate (6) during a first k clock periods of the BCH encoder (1). Further, at step S5, the method includes disconnecting, by the BCH encoder (1), the first gate (5) and connecting the second gate (6) after the first k clock period.

The foregoing description of the specific embodiment will so fully reveal the general nature of the embodiment herein that others can, by applying current knowledge, readily modify and/or adapt for various applications such specific embodiment without departing from the generic concept, and, therefore, such adaptations and modifications should and are intended to be comprehended within the meaning and range of equivalents of the disclosed embodiment. It is to be understood that the phraseology or terminology employed herein is for the purpose of description and not of limitation. Therefore, while the embodiment herein has been described in terms of preferred embodiment, those skilled in the art will recognize that the embodiment herein can be practiced with modification within the spirit and scope of the embodiment as described herein.

LIST TO REFERENCE NUMERALS

| Sr. No. | Description |
| --- | --- |
| 1 | BCH Encoder |
| 2 | Memory |
| 3 | Polynomial Generator |
| 4 | Registers |
| 5 | First Gate |
| 6 | Second Gate |
| 7 | Finite field adder circuit |

The invention claimed is:

1. A method for generating a Bose-Chadhuri-Hocquenghem (BCH) signal, wherein the method comprises:
   determining a BCH code (n, k), where n is a code length in bits, and k is a number of information bits;
   determining, by a BCH encoder, a minimum distance to be used for generating the BCH signal for the detected determined BCH code (n, k);
   generating, by the BCH encoder, a generator polynomial for the determined BCH code (n, k) based on the code length, the number of information bits, and the minimum distance; and
   encoding, by the BCH encoder, the generator polynomial to obtain the BCH signal based on a clock signal, wherein encoding the generator polynomial comprises:
      connecting, by the BCH encoder, a first gate and disconnecting a second gate during a first k clock periods of the BCH encoder; and
      disconnecting, by the BCH encoder, the first gate and connecting the second gate after the first k clock periods.

2. The method of claim 1, wherein the BCH code (n, k) is one of a BCH (52, 9) primitive code, a BCH (52, 9) non-primitive code, and a BCH (64, 17) non-primitive code.

3. The method of claim 2, wherein the minimum distance of the BCH (52, 9) primitive code, and the BCH (52, 9) non-primitive code is 20.

4. The method of claim 2, wherein the minimum distance of the BCH (64, 17) non-primitive code is 23.

5. The method of claim 2, wherein the generator polynomial of the BCH (52, 9) primitive code is one of $x^9+x^8+x^7+x^6+x^2+x+1$, $x^9+x^7+x^6+x^3+x^2+x+1$, and $x^9+x^8+x^7+x^3+x^2+x+1$.

6. The method of claim 2, wherein the generator polynomial of the BCH (52, 9) non-primitive code is one of $x^9+x^8+x^7+x^6+x^5+x^3+x^2+x+1$, and $x^9+x^8+x^7+x^6+x^5+x^4+x^2+x+1$.

7. The method of claim 2, wherein the generator polynomial of the BCH (64, 17) non-primitive code is $x^{17}+x^{16}+x^{14}+x^{13}+x^{10}+x^8+x^7+1$.

8. A Bose-Chadhuri-Hocquenghem (BCH) encoder for generating a BCH signal, wherein the BCH encoder comprises:
   a memory configured for storing a minimum distance to be used for generating the BCH signal for a BCH code (n, k), where n is a code length in bits, and k is a number of information bits; and
   a polynomial generator, connected to the memory, for generating a generator polynomial for the BCH code (n, k) based on the code length, the number of information bits, and the minimum distance, and encoding the generator polynomial to obtain the BCH signal, wherein the polynomial generator comprises:
      a set of k registers connected in series for receiving the information bits and output an encoded bit based on a clock signal;
      a first gate for receiving the code length, the number of information bits, and the minimum distance as input;

a second gate; and a finite field adder circuit, connected to the second gate, for determining a finite field sum of the output of each register of the set of k registers, wherein the polynomial generator encodes the generator polynomial by:

connecting the first gate and disconnecting the second gate during a first k clock periods of the BCH encoder; and disconnecting the first gate and connecting the second gate after the first k clock periods.

9. The BCH encoder of claim 8, wherein the BCH code (n, k) is one of a BCH (52, 9) primitive code, a BCH (52, 9) non-primitive code, and a BCH (64, 17) non-primitive code.

10. The BCH encoder of claim 9, wherein the minimum distance of the BCH (52, 9) primitive code, and the BCH (52, 9) non-primitive code is 20.

11. The BCH encoder of claim 9, wherein the minimum distance of the BCH (64, 17) non-primitive code is 23.

12. The BCH encoder of claim 9, wherein the generator polynomial of the BCH (52, 9) primitive code is one of $x^9+x^8+x^7+x^6+x^2+x+1$, $x^9+x^7+x^6+x^3+x^2+x+1$, and $x^9+x^8+x^7+x^3+x^2+x+1$.

13. The BCH encoder of claim 9, wherein the generator polynomial of the BCH (52, 9) non-primitive code is one of $x^9+x^8+x^7+x^6+x^5+x^3+x^2+x+1$, and $x^9+x^8+x^7+x^6+x^5+x^4+x^2+x+1$.

14. The BCH encoder of claim 9, wherein the generator polynomial of the BCH (64, 17) non-primitive code is $x^{17}+x^{16}+x^{14}+x^{13}+x^{10}+x^8+x^7+1$.

* * * * *